(12) United States Patent
Huang et al.

(10) Patent No.: US 11,960,323 B2
(45) Date of Patent: Apr. 16, 2024

(54) DISPLAY DEVICE WITH PROTECTION COMPONENT SUPPORTED BY SUPPORT COMPONENT

(71) Applicant: WUHAN CHINA STAR OPTOELECTRONICS SEMICONDUCTOR DISPLAY TECHNOLOGY CO., LTD., Wuhan (CN)

(72) Inventors: Hai Huang, Wuhan (CN); Wei Bi, Wuhan (CN)

(*) Notice: Subject to any disclaimer, the term of this patent is extended or adjusted under 35 U.S.C. 154(b) by 828 days.

(21) Appl. No.: 17/045,183

(22) PCT Filed: May 26, 2020

(86) PCT No.: PCT/CN2020/092238
§ 371 (c)(1),
(2) Date: Oct. 5, 2020

(87) PCT Pub. No.: WO2021/196373
PCT Pub. Date: Oct. 7, 2021

(65) Prior Publication Data
US 2023/0127432 A1 Apr. 27, 2023

(30) Foreign Application Priority Data
Apr. 2, 2020 (CN) .......................... 202010255996.6

(51) Int. Cl.
*G06F 1/16* (2006.01)
*G09F 9/30* (2006.01)

(52) U.S. Cl.
CPC ............ *G06F 1/1652* (2013.01); *G09F 9/301* (2013.01)

(58) Field of Classification Search
CPC ...... G06F 1/1652; G06F 1/1637; G09F 9/301; H10K 59/80; H10K 77/10; G02F 1/13452; G02F 1/133317
See application file for complete search history.

(56) References Cited

U.S. PATENT DOCUMENTS

| | | | |
|---|---|---|---|
| 10,516,119 B2 | 12/2019 | Lee | |
| 10,884,275 B2 * | 1/2021 | Yang | ................... G02F 1/13338 |
| 2010/0230155 A1 * | 9/2010 | Hashizume | ....... B29C 45/14836 |
| | | | 174/521 |
| 2012/0098426 A1 * | 4/2012 | Lee | ..................... H10K 50/841 |
| | | | 315/51 |

(Continued)

FOREIGN PATENT DOCUMENTS

| | | |
|---|---|---|
| CN | 104821138 A | 8/2015 |
| CN | 108242594 A | 7/2018 |

(Continued)

*Primary Examiner* — James Wu
*Assistant Examiner* — Christopher L Augustin

(57) ABSTRACT

The present invention provides a display device. The display device includes a back plate and a bending portion. The display panel includes laminated support components, display modules, and protection components. The support component includes a body and an extension portion. An interval region is defined between the display module and an inner side wall of the bending portion, the protection component includes a first portion corresponding to the interval region and a second portion located at an end portion of the bending portion, and the extension portion supports the first portion.

18 Claims, 4 Drawing Sheets

(56) References Cited

U.S. PATENT DOCUMENTS

| | | | |
|---|---|---|---|
| 2015/0253615 A1* | 9/2015 | Ryu | G02F 1/133602 |
| | | | 445/24 |
| 2018/0068594 A1 | 3/2018 | Dong | |
| 2018/0145124 A1 | 5/2018 | Kim et al. | |
| 2020/0057503 A1* | 2/2020 | Seomoon | G06F 3/04142 |
| 2020/0192431 A1* | 6/2020 | Shin | G06F 1/203 |
| 2020/0358013 A1 | 11/2020 | Zhou et al. | |
| 2020/0400995 A1 | 12/2020 | Zhou | |

FOREIGN PATENT DOCUMENTS

| | | |
|---|---|---|
| CN | 108254959 A | 7/2018 |
| CN | 108962035 A | 12/2018 |
| CN | 109785754 A | 5/2019 |
| CN | 109903681 A | 6/2019 |
| CN | 110187542 A | 8/2019 |
| CN | 110197622 A | 9/2019 |
| CN | 110728916 A | 1/2020 |
| CN | 209914239 U | 1/2020 |
| KR | 20150063876 A | 6/2015 |

\* cited by examiner

DISPLAY DEVICE WITH PROTECTION COMPONENT SUPPORTED BY SUPPORT COMPONENT

FIELD OF INVENTION

The present disclosure relates to the field of display technology, and more particularly, to a display device.

BACKGROUND OF INVENTION

At present, foldable flexible display modules have huge advantages such as low power consumption, high contrast, lightweight-ness and thinness, flexible foldability, etc. compared with mature liquid crystal display modules, and have been extensively studied. The foldable flexible display module is widely applied in a field of foldable display due to its light, thin, flexible, and foldable characteristics.

As shown in FIG. 1, in a process of dynamic folding a flexible display module 11, in order to maximize protection of a light-emitting layer of the flexible display module 11 from external forces, support components with good tensile and compression resistance, such as cover plates 13, a metal plates, and support plates, are generally designed in and assembled within the flexible display module 11.

However, around the flexible display module 11, especially on a bending side of the flexible display module 11, where a flexible printed circuit board is disposed, an interval is defined between the flexible display module 11 and a side wall of a protection casing 12, a portion of the cover plate 13 at the interval is without a support structure, and when an upper surface of the flexible display module 11 is touched, sagging occurs at the interval, resulting in poor surface flatness of a display device.

SUMMARY OF INVENTION

In current display devices, an interval is defined between the flexible display module and a side wall of a protection casing, a portion of the cover plate at the interval is without a support structure, and when an upper surface of the flexible display module is touched, sagging occurs at the interval, resulting in poor surface flatness of a display device.

In a first aspect, the present disclosure provides a display device, the display device comprises a display panel and a back frame, the back frame comprises a backplate and a bending portion connected to the backplate, an accommodating cavity is defined between the bending portion and the backplate, and the display panel comprises: a support component, wherein the support component comprises a body located in the accommodating cavity and an extension portion connected with the body; a display module, wherein the display module is disposed on a side of the body away from the backplate; and a protection component, wherein the protection component is disposed on a side of the display module away from the backplate; wherein an interval region is defined between the display module and an inner side wall of the bending portion, the protection component comprises a first portion corresponding to the interval region and a second portion located an end portion of the bending portion, and the extension portion supports the first portion.

In some embodiments, the display panel further comprises a connecting plate disposed on a side of the support component away from the display module, a driving component is disposed on the side of the connecting plate away from the support component, an opening is defined on extension portion, and an electrical connector penetrates through the opening and is electrically connected to the driving component and electrically connected to a side of the display module close to the bending portion.

In some embodiments, a protection layer is disposed on the extension portion covering a side of the opening.

In some embodiments, the end portion of the bending portion is defined as a stepped structure, the stepped structure comprises a first stepped surface and a second stepped surface that are sequentially arranged in a direction away from the display module, a vertical distance between the first stepped surface and the backplate is less than a vertical distance between the second stepped surface and the backplate, and the second portion is located on the first stepped surface.

In some embodiments, the second portion is connected to the bending portion.

In some embodiments, the extension portion is connected to the bending portion, and a protection layer is connected to the extension portion.

In some embodiments, at least portion of the extension portion is located between the second portion and the first stepped surface, the second portion is located on the extension portion and connected to the extension portion.

In some embodiments, the extension portion is in contact with a bottom side of the first portion.

In some embodiments, a spacer is disposed between the first portion and the extension portion, and the spacer is in contact with the first portion and the extension portion.

In some embodiments, an entire longitudinal section of the extension portion is bent-shaped or strip-shaped.

In a second aspect, the present disclosure further provides a display device, the display device comprises a display panel and a back frame, the back frame comprises a backplate and a bending portion connected to the backplate, the backplate and the bending portion are integrally formed, an accommodating cavity is defined between the bending portion and the backplate, and the display panel comprises: a support component, wherein the support component comprises a body located in the accommodating cavity and an extension portion connected with the body; a display module, wherein the display module is disposed on a side of the body away from the backplate; and a protection component, wherein the protection component is disposed on a side of the display module away from the backplate; wherein an interval region is defined between the display module and an inner side wall of the bending portion, the protection component comprises a first portion corresponding to the interval region and a second portion located an end portion of the bending portion, and the extension portion supports the first portion.

In some embodiments, the display panel further comprises a connecting plate disposed on a side of the support component away from the display module, a driving component is disposed on the side of the connecting plate away from the support component, an opening is defined on extension portion, and an electrical connector penetrates through the opening and is electrically connected to the driving component and electrically connected to a side of the display module close to the bending portion.

In some embodiments, a protection layer is disposed on the extension portion covering a side of the opening.

In some embodiments, the end portion of the bending portion is defined as a stepped structure, the stepped structure comprises a first stepped surface and a second stepped surface that are sequentially arranged in a direction away from the display module, a vertical distance between the first stepped surface and the backplate is less than a vertical distance between the second stepped surface and the backplate, and the second portion is located on the first stepped surface.

In some embodiments, the second portion is connected to the bending portion.

In some embodiments, the extension portion is connected to the bending portion, and a protection layer is connected to the extension portion.

In some embodiments, at least portion of the extension portion is located between the second portion and the first stepped surface, the second portion is located on the extension portion and connected to the extension portion.

In some embodiments, the extension portion is in contact with a bottom side of the first portion.

In some embodiments, a spacer is disposed between the first portion and the extension portion, and the spacer is in contact with the first portion and the extension portion.

In some embodiments, an entire longitudinal section of the extension portion is bent-shaped or strip-shaped.

The extension portion is configured to support a suspended portion of the protection component. Due to a support effect of the extension portion, a portion corresponding to the interval region of the protection component will not sag or be less a degree of sag, which improves surface flatness and reliability of the display device, and also prevent the electrical connector from deformation and damage due to depression of touch.

DESCRIPTION OF DRAWINGS

The detailed description of specific embodiments of the present disclosure will make technical solutions and other beneficial effects of the present disclosure obvious in the following with reference to drawings.

Figure 1:
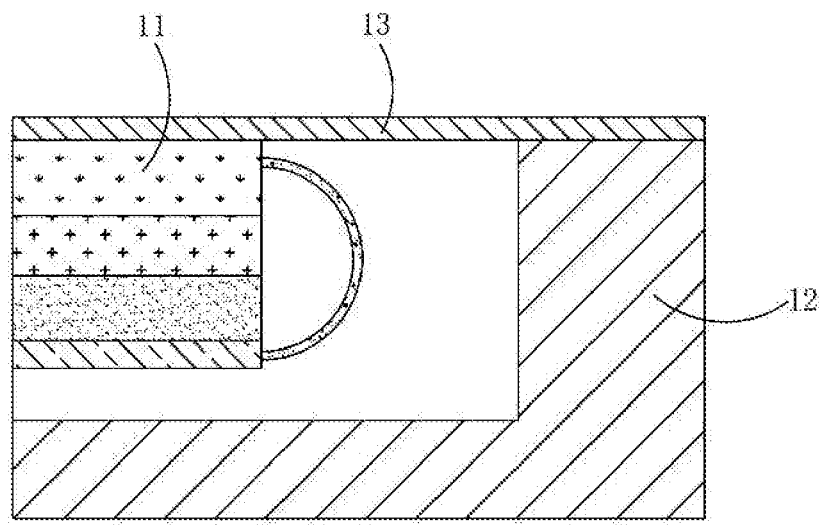
FIG. 1 is a schematic structural diagram of a display device in a background technology of the present disclosure.

Figure numerals: flexible display module 11, protection casing 12, cover plate 13, back frame 20, backplate 21, bending portion 22, first stepped surface 221, second stepped surface 222, accommodating cavity 23, interval region 24, display module 30, support component 40, body 41, extension portion 42, opening 421, protection component 50, first portion 51, second portion 52, connecting plate 60, buffer component 70, driving component 81, electrical connector 82, protection layer 91, bonding layer 92, and spacer 93.

DETAILED DESCRIPTION OF PREFERRED EMBODIMENTS

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

The present disclosure is directed to a technical problem in current display device, an interval is defined between the flexible display module and a side wall of a protection casing, a portion of the cover plate at the interval is without a support structure, and when an upper surface of the flexible display module is touched, sagging occurs at the interval, resulting in poor surface flatness of a display device. The present disclosure can solve the above problem.

Figure 2:
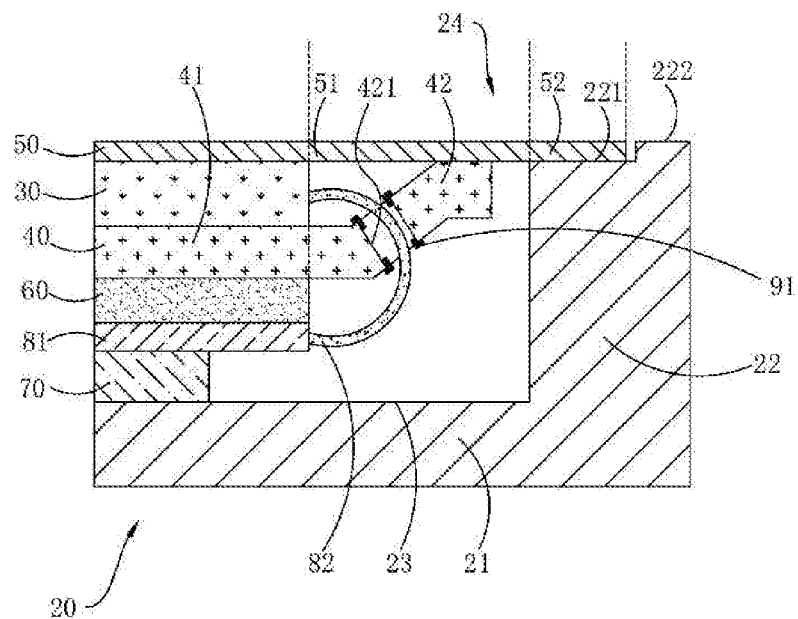
FIG. 2 is a schematic structural diagram of the display device in a first embodiment of the present disclosure.

A display device, as shown in FIG. 2, the display device comprises a display panel and a back frame 20, the display panel comprises a display body and a protection component 50 disposed on a light-emitting side of the display body.

Specifically, the back frame 20 comprises a backplate 21 and a bending portion 22 connected to the backplate 21. The bending portion 22 is disposed around a peripheral side of the backplate 21, and an accommodating cavity 23 is defined between the bending portion 22 and the backplate 21.

It should be noted that the backplate 21 and the bending portion 22 may be integrally formed, or after the backplate 21 and the bending portion 22 are separately formed, the backplate 21 and the bending portion 22 are assembled and spliced to form the back frame 20. The backplate 21 may be fixedly connected to the bending portion 22, or may be detachably connected to the bending portion 22. An angle defined between the bending portion 22 and the backplate 21 may be 90 degrees, or may be an obtuse angle greater than 90 degrees and less than 180 degrees, or an acute angle greater than 0 degrees and less than 90 degrees, which is not limited herein.

Specifically, the display body comprises a display module 30 and a support component 40. The support component 40 comprises a body 41 located in the accommodating cavity 23 and an extension portion 42 connected with the body 41, and the support component 40 may be a support plate or a metal plate.

It should be noted that the display module 30 may be a flexible display module, and the display module 30 comprises a plurality of laminated functional layers.

The body 41 and the extension portion 42 may be integrally formed, or may be rigidly connected by other means, such as welding, riveting, or a screw connection to realize a fixed connection between the extension portion 42 and the body 41.

Specifically, the display module 30 is disposed on a side of the body 41 away from the backplate 21, and the protection component 50 is disposed on a side of the display module 30 away from the backplate 21.

It should be noted that the display module 30 may be located in the accommodating cavity 23, and the protection component 50 is installed and fixed on the display module 30 to protect the display module 30, thereby preventing the display module 30 from being damaged due to collision or scratching. The protective component 50 may be a transparent glass cover or a transparent plastic cove, and may be a flexible cover or a hard cover.

Wherein, an interval region 24 is defined between the display module 30 and an inner side wall of the bending portion 22, the protection component 50 comprises a first portion 51 corresponding to the interval region 24 and a second portion 52 located an end portion of the bending portion 22, and the extension portion supports the first portion, the first portion 51 is disposed on the extension portion 42, and the extension portion 42 support the first portion 51.

The extension portion 42 supports the first portion 51 of the protection layer 91 located in the interval region 24, so that when the first portion 51 is prevented from being touched and pressed, due to a support of the extension portion 42, the first portion 51 corresponding to the interval region 24 will not sag or will sag less, which improves surface flatness and reliability of the display device.

It should be noted that the support component 40 needs to have both good tensile and compressive strength, as well as good thermal conductivity. The support component 40 may be made of stainless steel, magnesium aluminum alloys, aluminum-plated zinc plate, polymer plastics, and other amorphous materials. A thickness of the support component 40 may range from 0.1 mm to 0.5 mm.

Figure 3:
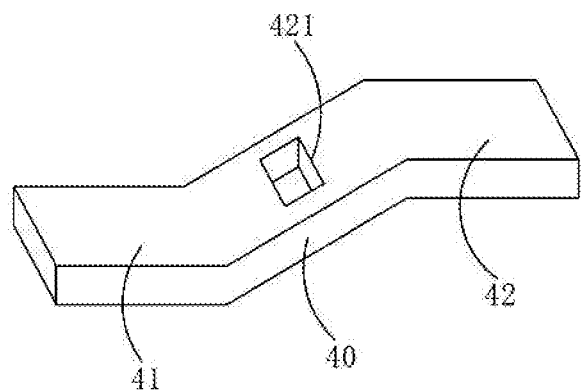
FIG. 3 is a schematic structural diagram of a support component in one embodiment of the present disclosure.

Specifically, as shown in FIG. 2 and FIG. 3, the display panel comprises a connecting plate 60 disposed on a side of the support component 40 away from the display module 30, a driving component 81 disposed on a side of the connecting plate 60 away from the support component 40, an opening 421 defined on the extension portion 42, and an electrical connector 82 penetrating through the opening 421 and electrically connected to both the driving component 81 and to a side of the display module 30 close to the bending portion 22.

Wherein, the driving component 81 provides a driving signal for the display module 30 and transmits the driving signal through the electrical connector 82. The electrical connector 82 is a signal transmission channel electrically connecting the display module 30 and the driving component 81. The electrical connector 82 may be a flexible printed circuit board electrically connected to the display module 30. The electrical connector 82 may also be integrally formed with one or more functional film layers in the display module 30.

It should be noted that FIG. 3 only illustrates a case where an end portion of the electrical connector 82 is not perpendicular to a right side of the display module 30. In an actual embodiment, it is preferable to design that the end of the electrical connector 82 to be perpendicular to the right side of the display module 30.

It should be noted that the opening 421 through which the electrical connector 82 penetrates is defined on the extension portion 42, thereby preventing a wiring of the electrical connector from being obstructed by the extension portion 42. At the same time, the support component 40 supports the first portion 51 of the protection component 50 and the display module 30, which can also prevent the electrical connector from deformation and damage due to sagging from touch.

It should be noted that the opening 421 penetrates an upper side and a lower side of the extension portion 42. A shape of the opening 421 may be set to match a shape of the electrical connector 82, and an area of the opening 421 may also be set to match an area of the electrical connector 82, which is convenient for the electrical connector 82 to penetrate through the opening 421, reduce the area of the extension 42 occupied by the opening 421, increase an overall strength of the extension 42, and prevent the extension portion 42 from breaking.

Furthermore, the opening 421 is defined on a portion of the extension portion 42 that is not in contact with the protection component 50.

Specifically, the protection layer 91 covering a side of the opening 421 is disposed on the extension portion 42. The protection layer 91 covers the side of the opening 421 to prevent the electrical connector 82 penetrating through the opening 421 from being scratched at the side of the opening 421.

In one embodiment, all sides and corners of the opening 421 are covered by the protection layer 91. The protective layer 91 may be made of adhesive tape or other materials with low hardness and strong flatness.

It should be noted that the support component 40 and the opening 421 can be manufactured using equipment such as a metal bending machine and a punching machine. The process is mature and production cost is low. During the manufacturing process, the sides of the opening 421 may be edged and deburred to prevent the electrical connector 82 from being scratched by burrs.

Specifically, a buffer component 70 is disposed on the backplate 21, and the driving component 81 is located on the buffer component 70.

Specifically, the end portion of the bending portion 22 is defined as a stepped structure, the stepped structure comprises a first stepped surface 221 and a second stepped surface 222 that are sequentially arranged in a direction away from the display module 30, a vertical distance between the first stepped surface 221 and the backplate 21 is less than a vertical distance between the second stepped surface 222 and the backplate 21, and the second portion 52 is located on the first stepped surface 221, thereby reducing an overall thickness of the display panel.

In a first embodiment, the second portion 52 is connected to the bending portion 22.

It should be noted that the second portion 52 can be connected to the bending portion 22 by a gluing method, and the second portion 52 can also be connected to the bending portion 22 by welding or other rigid connection methods, so that the protection component 50 is installed and fixed on the bending portion 22. Thus, the protection component 50 serves as a main load-bearing component. The support component 40 may only serve to support the first portion 51. The support component 40 may be connected to the protection component 50, or the support component 40 may be disconnected to the protection component 50.

Figure 4:
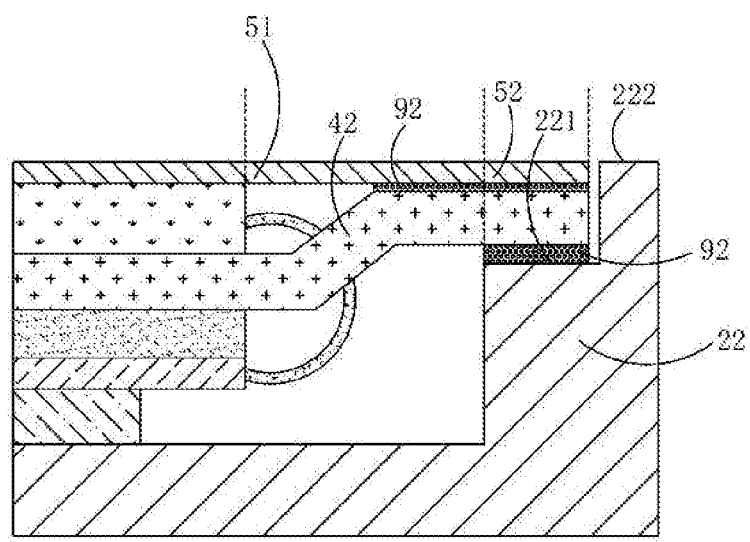
FIG. 4 to FIG. 6 are schematic structural diagrams of the display device in a second embodiment of the present disclosure.
Figure 6:
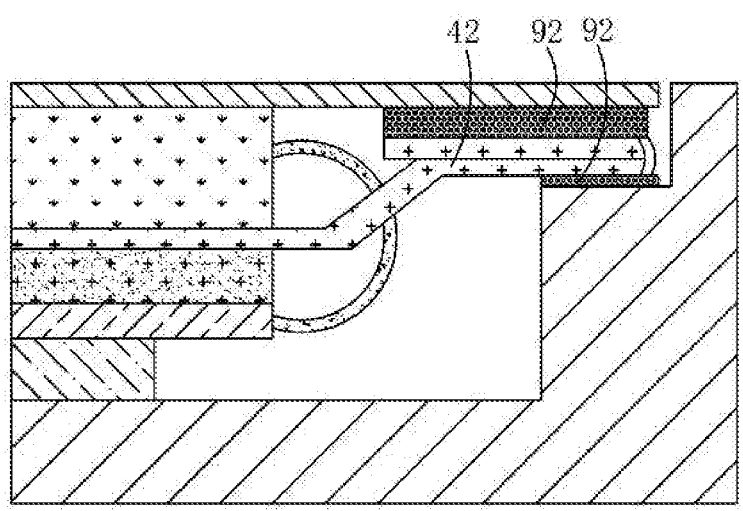

In a second embodiment, as shown in FIG. 4 and FIG. 6, the extension portion 42 is connected to the bending portion 22, and the protection layer 91 is connected to the extension portion 42.

It should be noted that the extension portion 42 may be connected to the protection component 50 and the bending portion 22 through a bonding layer 92, the extension portion 42 can also be connected to the protection component 50 and the bending portion 22 by welding or detachable connection, etc. A connection between the extension portion 42 and the bending portion 22 is configured to connect the display module 30 and the back frame 20.

Furthermore, at least a portion of the extension portion 42 is located between the second portion 52 and the first stepped surface 221, and the second portion 52 is located on the extension portion 42 and is connected to the extension portion 42.

It should be noted that, at this time, not only does the support component 40 support the first portion 51 and prevent the first portion 51 from sagging when pressing the first portion 51, the support component 40 also serves as a main load-bearing component.

Figure 5:
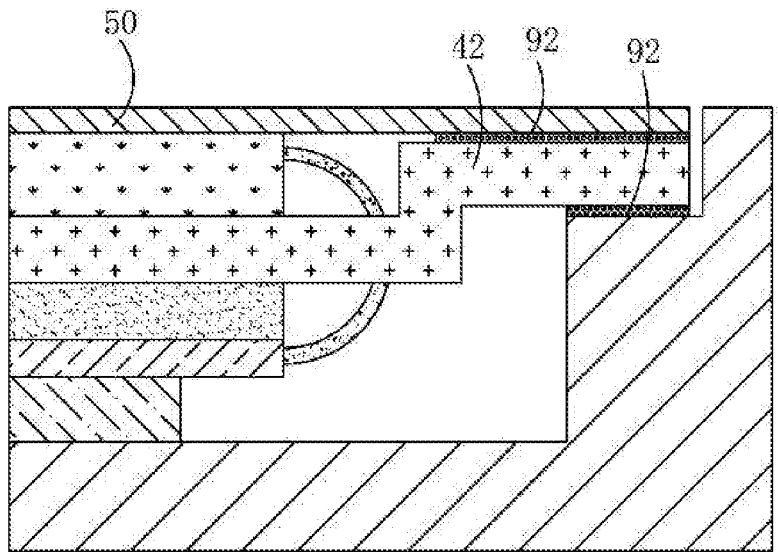

Wherein, an entirety of a longitudinal section of the extension portion 42 is bent-shaped. A bending angle of the extension portion 42 may be a non-orthogonal angle (shown in FIG. 4), and the bending angle may also be an orthogonal angle (shown in FIG. 5), and the extension portion 42 may also be reverse-folded (shown in FIG. 6).

Figure 7:
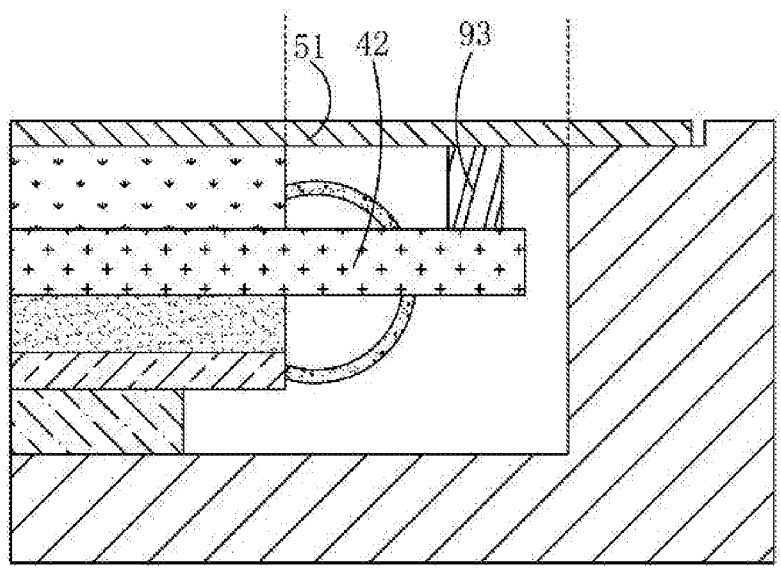
FIG. 7 is a schematic structural diagram of the display device in a third embodiment of the present disclosure.

As shown in FIG. 7, the entirety of the longitudinal section of the extension portion is strip-shaped.

Specifically, a spacer 93 is disposed between the first portion 51 and the extension portion 42, and the spacer 93 is in contact with the first portion 51 and the extension portion 42. The spacer 93 is configured to support the first portion 51 by the extension portion 42, which reduces a region occupied by the extension portion 42, and prevents the extension portion 42 from obstruction caused by an arrangement of other components in the display panel.

It should be noted that the extension portion 42 may also be in contact with a bottom side of the first portion 51 (as shown in FIG. 2), that is, the extension portion 42 is in direct contact with the first portion 51, thereby supporting the first portion 51.

It should be noted that FIGS. 2 to 7 only illustrate a case where the interval region 24 and the extension portion 42 are defined between one side of the display module 30 and the bending portion 22.

Figure 8:
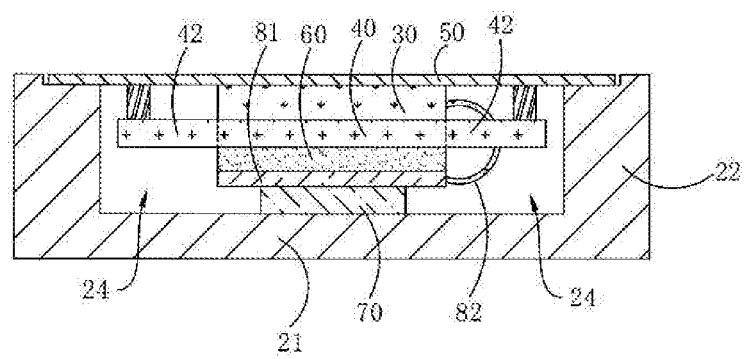
FIG. 8 is a schematic structural diagram of the display device in a fourth embodiment of the present disclosure.

As shown in FIG. 8, the interval region 24 and the extension portion 42 may further disposed between four sides of the display module 30 and the bending portion 22, and the extended portion 42 is configured to support a suspended portion of the protection component 50, thereby improving strength and flatness of the display panel.

Beneficial effects of the present invention: the extension portion 42 is configured to support a suspended portion of the protection component 50. Due to a support effect of the extension portion 42, a portion corresponding to the interval region 24 of the protection component 50 will not sag or be less a degree of sag, which improves surface flatness and reliability of the display device, and also prevent the electrical connector 82 from deformation and damage due to depression of touch.

In the above embodiments, the description of each embodiment has its own emphasis. For a part that is not detailed in an embodiment, referring to the related descriptions of other embodiments.

The present disclosure uses specific examples to describe principles and embodiments of the present disclosure. The descriptions of the above embodiments are only used to help understand technical solutions of the present disclosure and core ideas thereof. Moreover, those of ordinary skill in the art should understand that the technical solutions described in the aforesaid embodiments can still be modified, or have some technical features equivalently replaced. However, these modifications or replacements do not depart from a scope of the technical solutions of the embodiments of the present disclosure.

What is claimed is:

1. A display device, wherein the display device comprises:
a display panel and a back frame, the back frame comprising a backplate and a bending portion connected to the backplate, an accommodating cavity being defined between the bending portion and the backplate,
wherein the display panel comprises:
a support component, wherein the support component comprises a body located in the accommodating cavity and an extension portion connected with the body;
a display module, wherein the display module is disposed on a side of the body away from the backplate;
a protection component, wherein the protection component is disposed on a side of the display module away from the backplate; and
a connecting plate disposed on a side of the support component away from the display module,
wherein a gap region is defined between the display module and an inner side wall of the bending portion, the protection component comprises a first portion corresponding to the gap region and a second portion located on an end portion of the bending portion, and the extension portion supports the first portion, and
a driving component is disposed on a side of the connecting plate away from the support component, the extension portion is provided with an opening, and an electrical connector that passes through the opening and is electrically connected to the driving component is disposed on a side of the display module close to the bending portion.

2. The display device as claimed in claim 1, wherein a protection layer is disposed on the extension portion to cover a side of the opening.

3. The display device as claimed in claim 1, wherein the end portion of the bending portion is defined as a stepped structure, the stepped structure comprises a first stepped surface and a second stepped surface that are sequentially arranged in a direction away from the display module, a vertical distance between the first stepped surface and the backplate is less than a vertical distance between the second stepped surface and the backplate, and the second portion is located on the first stepped surface.

4. The display device as claimed in claim 3, wherein the second portion is connected to the bending portion.

5. The display device as claimed in claim 3, wherein the extension portion is connected to the bending portion, and the protection component is connected to the extension portion.

6. The display device as claimed in claim 5, wherein at least a portion of the extension portion is located between the second portion and the first stepped surface, and the second portion is located on the extension portion and is connected to the extension portion.

7. The display device as claimed in claim 1, wherein the extension portion is in contact with a bottom side of the first portion.

8. The display device as claimed in claim 1, wherein a spacer is disposed between the first portion and the extension portion, and the spacer is in contact with the first portion and the extension portion.

9. The display device as claimed in claim 1, wherein an entire longitudinal section of the extension portion is bent-shaped or strip-shaped.

10. A display device, wherein the display device comprises:
a display panel and a back frame, the back frame comprising a backplate and a bending portion connected to the backplate, the backplate and the bending portion being integrally formed, an accommodating cavity being defined between the bending portion and the backplate,
wherein the display panel comprises:
a support component, wherein the support component comprises a body located in the accommodating cavity and an extension portion connected with the body;
a display module, wherein the display module is disposed on a side of the body away from the backplate;
a protection component, wherein the protection component is disposed on a side of the display module away from the backplate; and
a connecting plate disposed on a side of the support component away from the display module, wherein a gap region is defined between the display module and an inner side wall of the bending portion, the protection component comprises a first portion corresponding to the gap region and a second portion located on an end portion of the bending portion, and the extension portion supports the first portion, and a driving component is disposed on a side of the connecting plate away from the support component, the extension portion is provided with an opening, and an electrical connector that passes through the opening and is electrically connected to the driving component is disposed on a side of the display module close to the bending portion.

11. The display device as claimed in claim 10, wherein a protection layer is disposed on the extension portion to cover a side of the opening.

12. The display device as claimed in claim 10, wherein the end portion of the bending portion is defined as a stepped structure, the stepped structure comprises a first stepped surface and a second stepped surface that are sequentially arranged in a direction away from the display module, a vertical distance between the first stepped surface and the backplate is less than a vertical distance between the second stepped surface and the backplate, and the second portion is located on the first stepped surface.

13. The display device as claimed in claim 12, wherein the second portion is connected to the bending portion.

14. The display device as claimed in claim 12, wherein the extension portion is connected to the bending portion, and the protection component is connected to the extension portion.

15. The display device as claimed in claim 14, wherein at least a portion of the extension portion is located between the second portion and the first stepped surface, and the second portion is located on the extension portion and is connected to the extension portion.

16. The display device as claimed in claim 10, wherein the extension portion is in contact with a bottom side of the first portion.

17. The display device as claimed in claim 10, wherein a spacer is disposed between the first portion and the extension portion, and the spacer is in contact with the first portion and the extension portion.

18. The display device as claimed in claim 10, wherein an entire longitudinal section of the extension portion is bent-shaped or strip-shaped.

\* \* \* \* \*